United States Patent
Aalund et al.

(10) Patent No.: US 6,813,543 B2
(45) Date of Patent: Nov. 2, 2004

(54) SUBSTRATE HANDLING SYSTEM FOR ALIGNING AND ORIENTING SUBSTRATES DURING A TRANSFER OPERATION

(75) Inventors: Martin Aalund, Sunnyvale, CA (US); Steve Remis, Ford City, PA (US); Alexandra Lita, San Jose, CA (US); Guokun Ciu, Fremont, CA (US); Brian Loiler, Sunnyvale, CA (US); Ray Rhodes, San Jose, CA (US)

(73) Assignee: Brooks-Pri Automation, Inc., Billerica, MA (US)

( * ) Notice: Subject to any disclaimer, the term of this patent is extended or adjusted under 35 U.S.C. 154(b) by 0 days.

(21) Appl. No.: 10/267,008

(22) Filed: Oct. 8, 2002

(65) Prior Publication Data

US 2004/0068347 A1 Apr. 8, 2004

(51) Int. Cl.[7] .............................................. G06F 19/00
(52) U.S. Cl. ....................... 700/245; 700/248; 700/249; 700/250; 700/258; 700/260; 700/275; 414/416.09; 414/941; 74/490.03; 701/23
(58) Field of Search ................................ 700/245, 248, 700/249, 250, 258, 260, 275; 414/416.09, 941; 701/23; 74/490.03

(56) References Cited

U.S. PATENT DOCUMENTS

| | | | | |
|---|---|---|---|---|
| 5,221,356 A | * | 6/1993 | Hillier et al. | 118/730 |
| 5,331,458 A | * | 7/1994 | Bacchi et al. | 359/393 |
| 5,446,584 A | * | 8/1995 | Bacchi et al. | 359/393 |
| 5,538,385 A | * | 7/1996 | Bacchi et al. | 414/403 |
| 5,646,776 A | * | 7/1997 | Bacchi et al. | 359/393 |
| 5,765,444 A | * | 6/1998 | Bacchi et al. | 74/490.03 |
| 6,105,454 A | * | 8/2000 | Bacchi et al. | 74/490.03 |
| 6,126,381 A | * | 10/2000 | Bacchi et al. | 414/754 |
| 6,155,768 A | * | 12/2000 | Bacchi et al. | 414/416.03 |
| 6,256,555 B1 | * | 7/2001 | Bacchi et al. | 700/245 |
| 6,275,748 B1 | * | 8/2001 | Bacchi et al. | 700/275 |
| 6,357,996 B2 | * | 3/2002 | Bacchi et al. | 414/754 |
| 6,360,144 B1 | * | 3/2002 | Bacchi et al. | 700/250 |
| 6,366,830 B2 | * | 4/2002 | Bacchi et al. | 700/250 |
| 6,438,460 B1 | * | 8/2002 | Bacchi et al. | 700/275 |
| 6,453,214 B1 | * | 9/2002 | Bacchi et al. | 700/245 |
| 6,618,645 B2 | * | 9/2003 | Bacchi et al. | 700/254 |
| 2003/0053902 A1 | * | 3/2003 | Yokota et al. | 414/744.2 |
| 2003/0055533 A1 | * | 3/2003 | Bacchi et al. | 700/275 |
| 2003/0133776 A1 | * | 7/2003 | Lee | 414/416.03 |

* cited by examiner

Primary Examiner—Thomas G. Black
Assistant Examiner—McDieunel Marc
(74) Attorney, Agent, or Firm—Weingarten, Schurgin, Gagnebin & Lebovici LLP; Richard Pickreign

(57) ABSTRACT

A system is provided for sensing, orienting, and transporting wafers in an automated wafer handling process that reduces the generation of particles and contamination so that the wafer yield is increased. The system includes a robotic arm for moving a wafer from one station to a destination station, and an end-effector connected to an end of the robotic arm for receiving the wafer. The end-effector includes a mechanism for gripping the wafer, a direct drive motor for rotating the wafer gripping mechanism, and at least one sensor for sensing the location and orientation of the wafer. A control processor is provided for calculating the location of the center and the notch of the wafer based on measurements by the sensor(s). Then, the control processor generates an alignment signal for rotating the wafer gripping mechanism so that the wafer is oriented at a predetermined position on the end-effector while the robotic arm is moving to another station.

63 Claims, 4 Drawing Sheets

SUBSTRATE HANDLING SYSTEM FOR ALIGNING AND ORIENTING SUBSTRATES DURING A TRANSFER OPERATION

CROSS REFERENCE TO RELATED APPLICATIONS

N/A

STATEMENT REGARDING FEDERALLY SPONSORED RESEARCH OR DEVELOPMENT

N/A

BACKGROUND OF THE INVENTION

In semiconductor fabrication processes, wafers are transferred between stations, such as storage, queuing, processing and other work stations. In typical automated wafer handling processes, a wafer is first picked up by a robotic arm for transfer from one station to another station. Next, the wafer is placed on an aligner for aligning and centering the wafer to a desired position using a notch or flat located on the wafer's edge. Once properly aligned, the wafer is then placed in the desired station for processing. After the processing is completed at the desired station, the wafer may then be picked up and placed again at another station.

Each time that the wafer is picked up, placed, and aligned, contact is made with either the edge or the back side of the wafer and particles are generated. For instance, in a single wafer process cycle, the wafer may be contacted as many as twelve times when using a three-axis aligner or at least eight times when a single axis aligner is used.

In addition, the alignment process requires a dedicated aligning device and a separate step in the wafer process cycle. The dedicated aligning device often creates a bottle-neck that limits the wafer throughput in the system and also introduces additional handling that generates particles. Adding aligners to the system may help to slightly increase this throughput problem but creates an undesirable increase in the cost, complexity and generation of particles to the wafer handling system. Accordingly, a system is desired for enhancing the wafer handling process by reducing the generation of particles and wafer damage so that the wafer yield is increased. Also, it is desired to increase the wafer throughput by performing the alignment process in parallel with moving the wafer.

SUMMARY OF THE INVENTION

The present invention is directed to a system for locating and orienting substrates, such as semiconductor wafers, during the pick up and transfer steps in an automated substrate handling process. In a semiconductor fabrication process, the system is able to reduce the generation of particles from and the contamination of semiconductor wafers. As a result, the wafer yield and throughput of the fabrication process are increased.

More particularly, the system includes a robotic arm for moving a wafer from one station to another station. An end-effector is connected to an end of the robotic arm for handling the wafer. The end-effector may include a mechanism for gripping the wafer, a mechanism, such as a motor, for moving the wafer gripping mechanism, and at least one sensory system for sensing the location and orientation of the wafer. A control processor operatively connected to the robotic arm and the end-effector calculates the location of the center and a notch or flat of the wafer based on data from the at least one sensory system. The control processor generates a signal to move the wafer gripping mechanism so that the wafer is centered on the end-effector when picked by the end-effector and is oriented at a predetermined position on the end-effector while the robotic arm is moving to another station. After the wafer is picked up by the end-effector, the control processor can refine the calculation of the center of the wafer and adjust the wafer's orientation before being dropped off at the next station.

Other aspects, features and advantages of the present invention are disclosed in the detailed description that follows.

DESCRIPTION OF THE DRAWINGS

The invention will be more fully understood by reference to the following detailed description of the invention in conjunction with the drawings, of which.

DETAILED DESCRIPTION OF THE INVENTION

A substrate handling system according to the present invention provides a robotic arm configured to handle substrates, such as semiconductor wafers, reticles, etc. The system is operative to sense the substrate and center the substrate with respect to the robotic arm's end-effector prior to picking up the substrate. The system is also operative to orient the substrate in a desired orientation and to calculate the center of the wafer during transfer of the substrate to a destination station. The system is particularly useful in transferring semiconductor wafers between stations in a semiconductor fabrication process. The system reduces the amount of wafer handling necessary between stations so that the generation of particles from and contamination of the wafers decreases, increasing wafer yield. The system eliminates a separate alignment step, thereby increasing wafer throughput.

Figure 1:
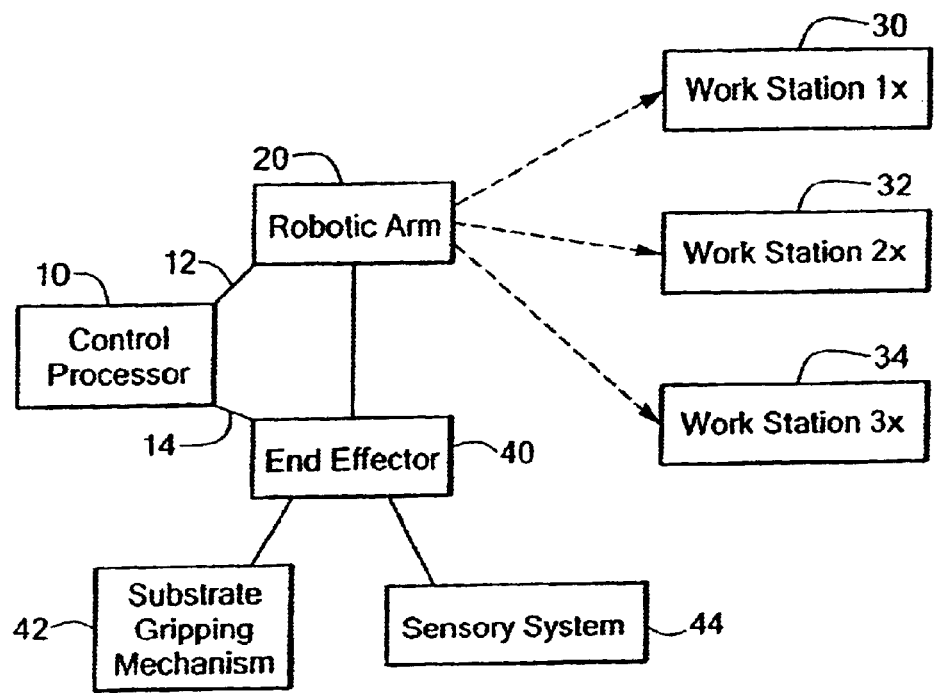
FIG. 1 illustrates a block diagram of a wafer handling system according to an embodiment of the present invention.

Referring to FIG. 1, the system includes one or more robotic arm assemblies 20 operatively communicative with a control processor 10 by, for example, a bus, cable or wireless connection 12. Each of the robotic arm assemblies 20 includes an end-effector 40 operatively communicative with the control processor 10 by a bus, cable or wireless connection 14, which will be described in more detail below, and is associated with one or more stations 30, 32 and 34 for moving substrates, such as wafers, therebetween. The end-effector 40 includes a substrate gripper or mechansim 42 and a sensory system 44. The control processor 10 calculates the location of the center and an alignment feature, such as a notch or flat of the wafer, based on data from sensors on the end-effector and generates centering, aligning, and orienting signals for the end-effector based on these calculations. The control processor 10 computes and communicates to the robotic arm assemblies 20 the actual substrate center position, and the arm assembly positions the end-effector 40 centered relative to the substrate before gripping the substrate.

After the end-effector 40 grips the centered wafer, the control processor 10 generates additional signals for rotating the wafer and processing the sensor signals in order to finally re-compute the wafer center, find the notch or flat position and rotate the notch or flat in a desired position. The orientation, alignment and robotic arm trajectory correction are performed while the robotic arm moves the wafer from one station to another station. The control processor 10 may include distributed control architecture for performing the orientation, alignment and correction. The control processor 10 may also be mounted in close proximity to the end-effector 40 for independently controlling the alignment feature.

Figure 2:
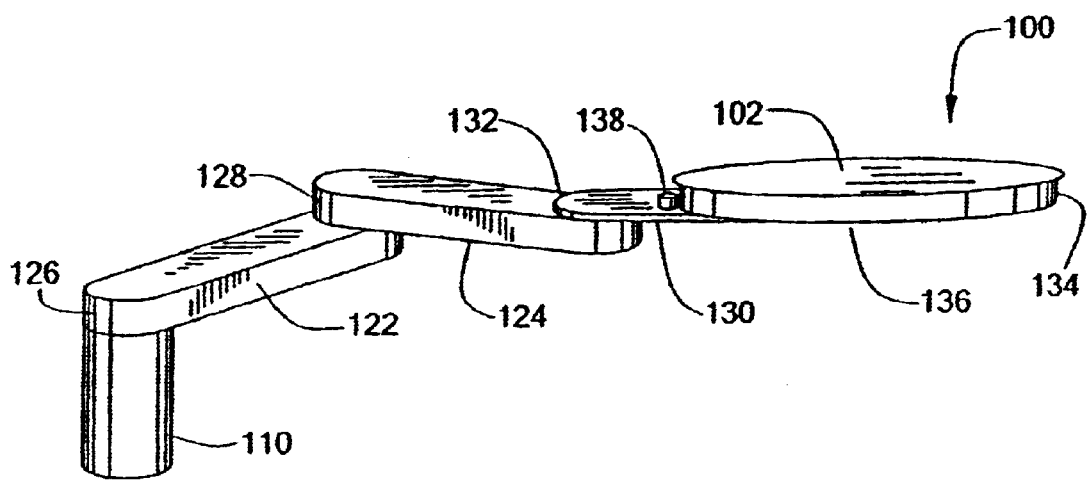
FIG. 2 illustrates a robotic arm and an end-effector used in a wafer handling system according to an embodiment of the present invention.

FIG. 2 schematically illustrates a typical robotic arm assembly 100 for moving a semiconductor wafer 102 from one station to another station in the semiconductor fabrication process. The arm assembly 100 includes an arm 120 mounted on a support 110, such as a central column that houses a lifting mechanism (not shown) to raise and lower the arm vertically. The arm 120 includes an inner arm 122, an outer arm 124, and the end-effector 130. The inner arm 122 is supported by the central column 110 at a rotatable "shoulder" joint 126 to effect rotation about a vertical axis through the central column 110. Similarly, the outer arm 124 is mounted to the inner arm 122 at a rotatable "elbow" joint 128 for rotation about a vertical axis, and the end-effector 130 is mounted to the outer arm 124 at a rotatable "wrist" joint 132 for rotation about a vertical axis. Rotation about the three rotatable joints 126, 128 and 132 allows the end-effector 130 to move to any coordinate position in a horizontal plane, while translation of the arm 120 on the central column provides vertical motion. It will be appreciated that the present invention can be used with other robotic arm configurations.

The end-effector 130 includes a wafer gripping mechanism 134, such as a vacuum wafer chuck, for gripping the wafer 102. It is appreciated that edge grippers and other known wafer handling mechanisms may also be used. A motor 136 or other suitable mechanism is provided for rotating the wafer gripping mechanism 134 when orientation is required. One or more sensors 138 are mounted at fixed and known locations on the end-effector 130 to sense the location and notch orientation of the wafer 102 with respect to the end-effector 130, described further below. Data collected by the sensors 138 is communicated to the control processor 10, which calculates the center of the wafer 102 and the location of its notch or flat before the wafer 102 is gripped by the wafer gripping mechanism 134. With the location data from the sensors 138, the known center of the end-effector 130 is positioned underneath the calculated center of the wafer 102, the end-effector 130 is raised until the wafer gripping mechanism 134 contacts the underside of the wafer 102, and the wafer gripping mechanism 134 is actuated to grip the wafer 102. Once the wafer 102 is gripped, the robotic arm assembly 100 moves the wafer 102 towards the next station. At the same time, the end-effector 130 aligns the wafer 102 by rotating the wafer gripping mechanism 134 to place the notch or flat of the wafer 102 in its desired orientation prior to releasing the wafer 102 at the next station.

Figure 3:
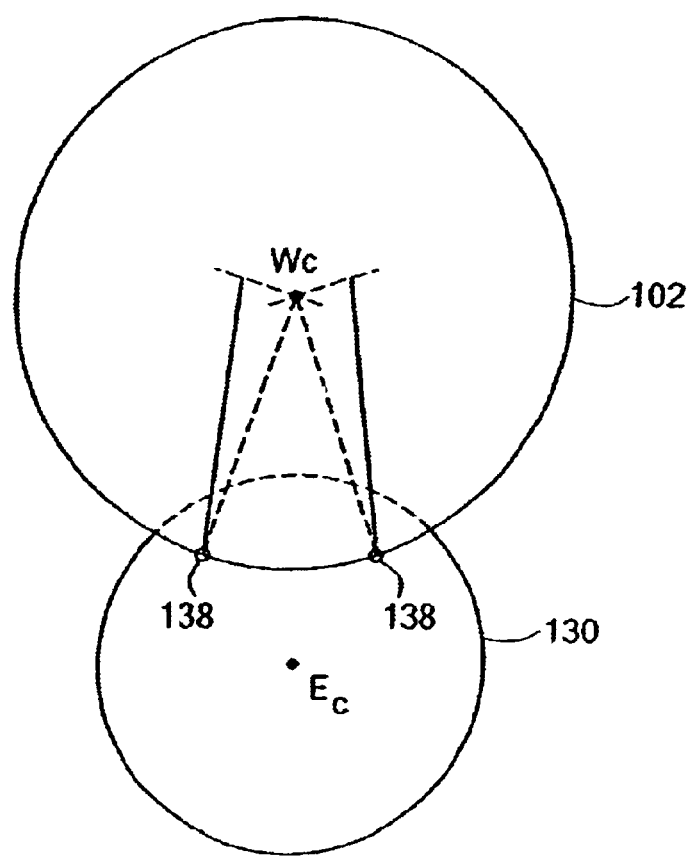
FIG. 3 illustrates exemplary wafer positioning measurements according to an embodiment of the present invention.

The control processor 10 is able to calculate the location of the wafer's center $W_c$ based on the sensor data. See FIG. 3. The diameter of the wafer 102 is known. Commonly in semiconductor fabrication, the wafers have a diameter of 300 mm. As noted above, the locations of the sensors 138 are fixed with respect to the end-effector 130 and are thus known by the control processor 10. Thus, the center of the wafer 102 can be determined by sensing at least two edge locations of the wafer 102, from which a chord length can be calculated. Note that, if the sensors 138 are located near the leading edge of the end-effector 130, that is, the edge of the end-effector 130 that first moves underneath the wafer 102, the control processor 10 can be instructed that the center of the wafer 102 is in front of the leading edge. Thus, two edge data points are sufficient to enable the calculation of the location of the center of the wafer 102 of known diameter. The control processor 10 is then able to move the end-effector 130 to a desired alignment with respect to the wafer 102, for example, with the wafer center $W_c$ over a center $E_c$ or other desired point of the end-effector 130.

Preferably, at least two sensors are placed at known locations on the end-effector to sense at least two wafer edge locations. It will be appreciated, however, that a single sensor on the end-effector can be used if the sensor is suitably moved to sense two or more separate edge locations on a wafer. It will also be appreciated that a greater number of sensors can be used to provide a greater number of data points. If more than two data points are used, an average of the calculated center points can be determined.

Figure 4:
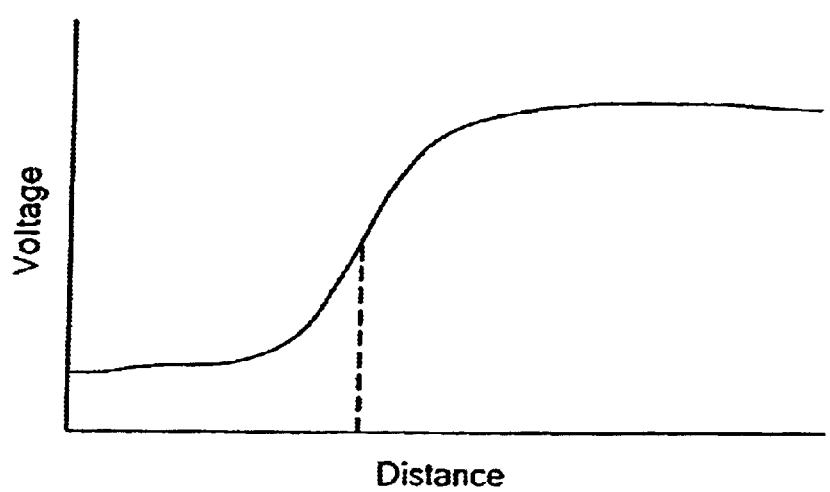
FIG. 4 illustrates an example of a voltage output curve from a capacitive sensor that may be used for sensing wafer edges.

The sensors 138 can be of any suitable type, such as capacitive, optical, acoustic, or ultrasonic sensors. As an example, if a capacitive sensor is used, the capacitance increases as the sensor moves underneath a wafer. For each sensor, a voltage output, which is proportional to impedance, is generated to select an appropriate edge point, indicated, as an example, by a vertical dashed line on FIG. 4. The actual edge point selected for use in the subsequent calculations is determined by a set of real time measurements and voltage/distance curves. The data processing algorithm can use look-up tables, statistical inference, or artificial intelligence, as would be known by one of skill in the art.

The detected capacitance is also dependent on the distance from the sensors to the bottom surface of the wafer. This distance can vary if the wafer is, for example, warped or tilted within the storage container. Thus, a sensor to detect this distance is preferably provided. This sensor is located to pass underneath the wafer in advance of the edge-detecting sensor. In this manner, the distance to the wafer can be provided, which enables a better determination of the edge to be made. For example, a calibration curve or look-up table can be provided for the appropriate distance from the wafer. Also, if the wafer is warped or tilted, the wafer may not be gripped correctly. Typically, if the wafer is not gripped correctly, the wafer gripping device ungrips and regrips or it aborts the grip and reports an error. Thus, the distance sensors can be used to determine if warping or a tilted wafer is present and to improve the robustness of the system.

Once the end-effector 130 is in alignment with the wafer 102, the end-effector 130 is raised vertically until it contacts the wafer 102. The wafer gripping mechanism 134 is engaged to grip the wafer 102. For example, if the wafer gripping mechanism 134 is a vacuum chuck, the chuck is actuated to draw the underside of the wafer 102 to the chuck. The robotic arm assembly 100 then begins the transfer of the wafer 102 to the next station. During this transfer, the wafer gripping mechanism 134 may be rotated until the notch or flat of the wafer 102 is detected by one of the sensors 138 located on the end-effector 130 for purposes of detecting the notch. Once the notch is detected, the wafer gripping mechanism 134 is rotated until the notch is located in the desired orientation for placement at the destination station.

Figure 5:
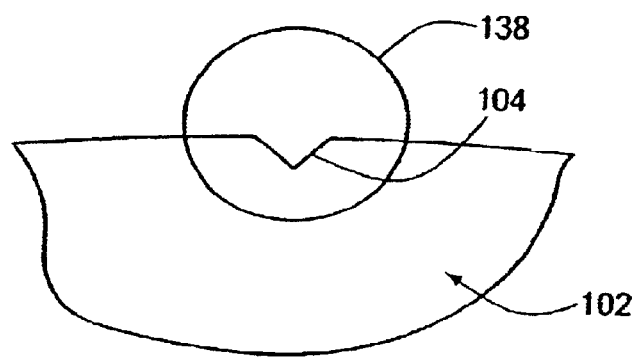
FIG. 5 illustrates a wafer notch measurement according to an embodiment of the present invention.

The notch may be detected in any suitable manner. For example, using a capacitive sensor, the capacitance decreases when the notch overlays the sensor, which may appear as a spike in a voltage/distance curve. As shown in FIG. 5, when the notch 104 is positioned over one of the capacitive sensors 138, the value measured by the sensor decreases, and when the notch 104 is not positioned over any of the sensors 138, the value measured by the sensor increases. In this example, a small sized sensor is preferred to increase the resolution of capacitive variance and enhance the accuracy in detecting the notch. Based on iterations of these calculations and comparisons, the position of the notch 104 on the wafer 102 may be determined. Once the notch 104 is detected, the wafer 102 may be oriented in the desired position.

The control processor 10 may also make further adjustments to the orientation of the wafer 102 during the placing step when the end-effector 130 approaches the destination station. For example, knowing the location of the center of the wafer 102 with respect to the end-effector 130, the control processor 10 can move the end-effector 130 as necessary to deposit the wafer 102 in a desired position at the destination station.

The system may also include a teach process for improving the true location of the stations when the system is initially configured and whenever a system component is changed, such as an aligner, POD door or stage, for instance. In the teach process, the sensors 138 are first moved under or over a datum plate or a locating feature (there may be multiple locating features) positioned at known coordinates within the system. The data from the sensors 138 are used to provide feedback on whether the robotic arm assembly 100 is level and its absolute position in the global coordinate system. The robotic arm assembly 100 is adjusted if the data suggests that it is not level.

Next, the robotic arm assembly 100 moves to each work station 30, 32, and 34. As the leading edge of the substrate is detected, the center of the substrate is calculated. This information is used as the new station location. Additionally, information is provided on whether the station is level by measuring the apparent distance from the substrate as the sensors move under or over the substrate. With this information, a user may manually adjust and level the station. These steps are repeated for all of the work stations. This information may be also used to measure system changes and to predict failures. This teach process may be performed to improve the true locations of a full end-aligner or end-effectors with sensors.

Figure 6:
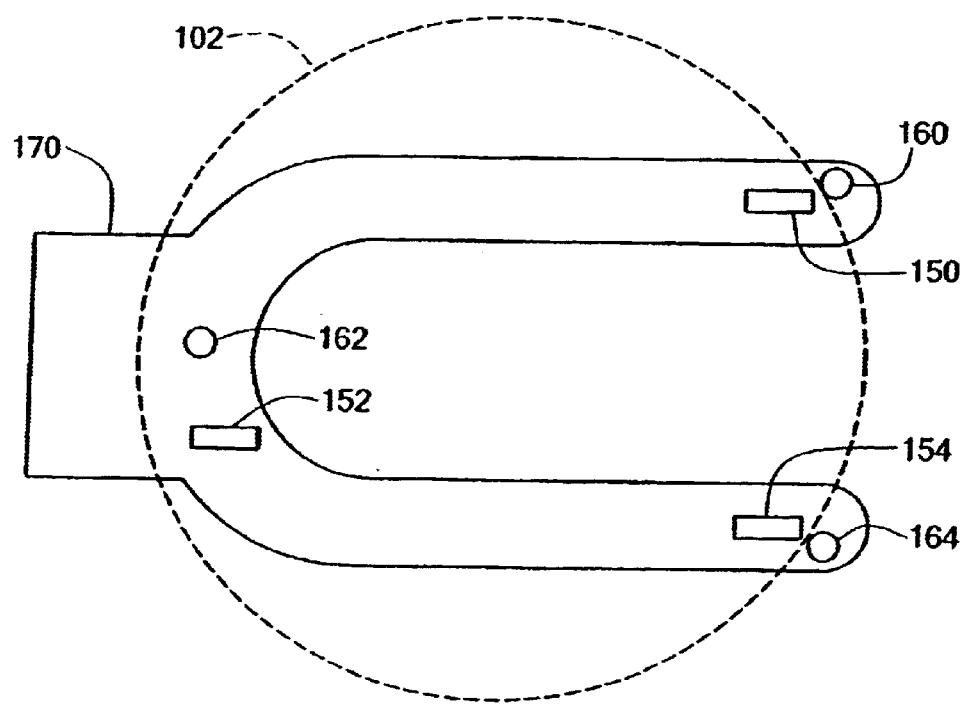
FIG. 6 illustrates a sensor configuration on an end-effector according to an embodiment of the present invention.

FIG. 6 illustrates an embodiment of the present invention in which six sensors 150, 152, 154, 160, 162 and 164 are placed at predetermined locations around the periphery of an end-effector base 170. In this embodiment, three rectangular sensors 150, 152 and 154 are used for sensing the edge of the wafer 102 and three circular sensors 160, 162 and 164 are used for sensing the notch and the distance of the wafer 102 from the end-effector base 170. The sensors 150, 152, 154, 160, 162 and 164 may be capacitive, acoustic, optical, reflective or other types of known sensors. This configuration of sensors allows the robotic arm to pick up the wafer and to grip the wafer without having the wafer slip along the surface of the wafer gripping mechanism or during placement in the station. The motion of the end-effector base 170 as it passes under the wafer 102 is used to detect the presence of the front and rear positions of the wafer 102. These measurements in combination with the geometry of the wafer (the diameter of the wafer) are used to determine the wafer's center and to adjust the pickup position in conjunction with geometric distance calculation algorithms. These measurements may also be used for controlling edge grippers to eliminate sliding or in cases where orientation of the notch is not required.

Although six sensors are used in the embodiment of FIG. 6, additional sensors and types of sensors may be used to increase the accuracy for calculating the center and compensating for errors such as a warped wafer, notches passing under the sensors and differences in substrate sizes. Generally, a straight motion by the end-effector under the wafer is used for pick up. However, other non-linear motions may be used to gather additional data points based on the number of sensors, and the size and shape of the substrate in conjunction with the motion. Such alternative motions may reduce the number of necessary sensors to as little as one sensor.

Figure 7:
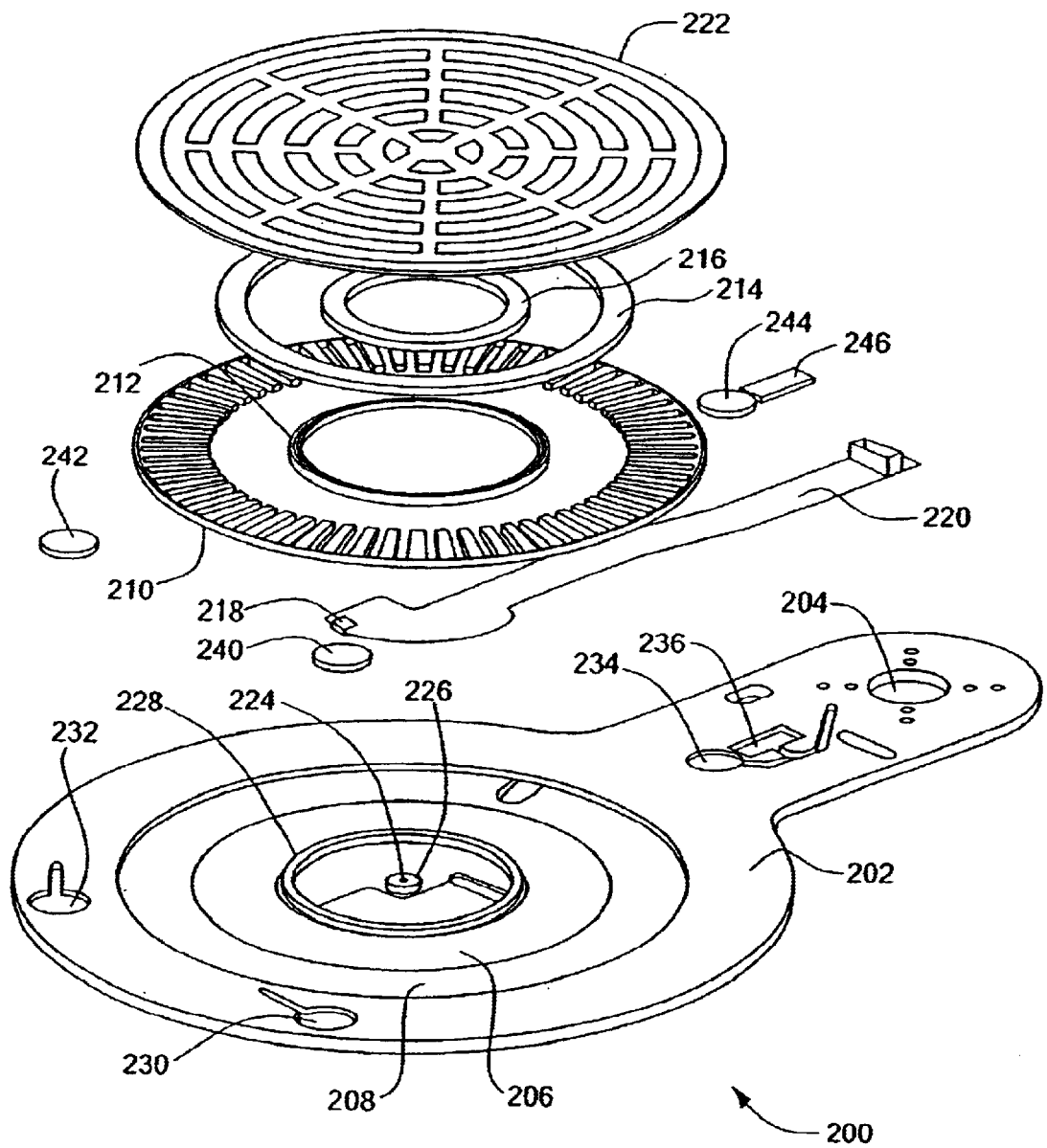
FIG. 7 illustrates a detailed view of an end-effector according to an embodiment of the present invention.

The end-effector, with its edge gripping mechanism, motor and sensors, must be sufficiently thin to fit between wafers stored in a stack. Typically, the distance between wafers in a stack is 10 mm of pitch and 0.77 mm of wafer thickness. FIG. 7 illustrates an embodiment of an end-effector 200 according to the present invention suitable for use with a stack of wafers with a small distance between the wafers. The end-effector 200 includes an end-effector base 202 that is connected to the robotic arm (not shown in this figure) at a connecting portion 204 thereof. The end-effector base 202 includes a first circular ledge 208 for receiving a motor stator 210 therein. The inner race 228 of the motor, such as a contact bearing, is seated on the end-effector base 202, that circularly extends up and around from the middle of the end-effector base 202. A motor rotor 214 and an encoder disk 216 are first disposed on the back surface of a wafer chuck 222. Then, the wafer chuck 222 with the motor rotor 214 and the encoder disk 216 together fit on the outer race of the contact bearing 212. After this fit, a gap between the encoder read head 218 and the encoder disk 216 is realized. Typically, the resulting gap is approximately 1 to 2 mm. An opening 224 at the center of the end-effector base 202 is connected to a vacuum channel (not shown). A ring seal 226 is disposed between the opening 224 of the end-effector base 202 and the bottom surface of the wafer chuck 222 for applying a vacuum across the top surface of the wafer chuck 222 to grip the wafers.

The end-effector base 202 further includes openings 230, 232, 234 and 236 for receiving sensors 240, 242, 244 and 246 that are positioned around the outer peripheral portion of the end-effector base 202. The openings 230, 232, 234 and 236 may be circular, rectangular, elliptical or other shapes and are dependent upon the designs of the sensors 240, 242, 244 and 246 that are being used for the sensing application. The sensors 240, 242, 244 and 246 may be capacitive, acoustical, optical, reflective or other known types of sensors for sensing applications such as determining the presence, absence and height of the wafer above the base, for example. To maximize the detection resolution, a plurality of sensors are positioned around the base and the surface area of each individual sensor is made as small as possible while still being large enough to detect edges and surfaces. Also, rectangular shaped sensors are preferred to detect wafer edges and circular shaped sensors to detect the distance of the wafer from the sensor in addition to edges and the notch of the wafer. However, it should be realized that different sensor shapes and sizes may be used depending upon the desired sensing application and resolution.

In the embodiment of FIG. 7, three circular sensors 240, 242 and 244 and one rectangular sensor 246 are positioned around the periphery of the end-effector base 202. Two of the circular sensors 240 and 242 are positioned towards the front the end-effector base 202 (typically the portion that first reaches the wafer) for first sensing wafer edges. The other circular sensor 244 and the rectangular sensor 246 are positioned near the periphery of the end-effector base 202 that connects to the robotic arm. Measurements from the rectangular sensor 246 and the two front sensors 240 and 242 are sent to the control processor and are used to center the wafer on the wafer chuck 222. Measurements from the three circular sensors 240, 242 and 244 are also used to align the planes of the wafer chuck 222 and the underside of the wafer. Once the wafer is centered and aligned, the vacuum is applied to the wafer chuck 222 and the wafer is gripped.

The robotic arm then moves the wafer to another station. While the robotic arm is moving, one of the three circular sensors 240, 242 and 244 is used to detect the notch. The three circular sensors 240, 242 and 244 are positioned so that the edge of the wafer passes substantially through the middle of each sensor. Once one of the sensors detects that the notch is directly over it, the control processor may then generate orienting signals to the end-effector 200 so that the notch is positioned at the desired orientations. This orientation is typically completed during the time that it takes for the wafer to reach the destination station.

The present system centers the wafer on the wafer gripping mechanism and positions the notch or flat in the desired orientation while moving the wafer from one station to a destination station without the need for a separate aligning or centering device. Because impacts between the wafer and the end-effector or the wafer and a cassette or stand generate particles that may damage the wafer, the present invention desirably minimizes picking up and placing of the wafers during the handling process. By eliminating an aligning device, at least one pick up and placing step is eliminated in the processing for each wafer. As a result, the wafer throughput is greatly improved since the alignment is done in parallel with the motion of the robotic arm, which reduces both processing time and equipment costs. For instance, if a cassette of 25 wafers is processed, a considerable amount of time can be saved in addition to improving the reliability of the system while drastically reducing particle generation to improve wafer yield.

It will be apparent to those skilled in the art that other modifications to and variations of the above-described techniques are possible without departing from the inventive concepts disclosed herein. Accordingly, the invention should be viewed as limited solely by the scope and spirit of the appended claims.

What is claimed is:

1. A system for transporting a substrate comprising:
   a robotic arm mounted on a support movable vertically and positionable in a horizontal plane for moving a substrate from one station to another station;
   an end-effector movably connected to an end of said robotic arm, said end-effector including:
      a base;
      a substrate gripper movably mounted on said base and operative to grip and ungrip the substrate; and
      at least one sensory system disposed to sense an edge of the substrate upon passing a surface of the substrate; and
   a control processor in communication with the end-effector and the at least one sensory system and operative to calculate at least one of a location of the center and an alignment feature of said substrate based on data from said at least one sensory system and to generate an alignment signal to move said substrate gripper and to transmit an instruction to the end-effector to orient said substrate with respect to said robotic arm while said robotic arm moves said substrate from the one station to the other station.

2. A system according to claim 1, wherein the at least one sensory system is disposed to pass an underside of said substrate.

3. The system according to claim 1, wherein the substrate gripper comprises a motor.

4. The system according to claim 3, wherein the motor comprises an annular stator and an annular rotor overlying the annular stator.

5. The system according to claim 3, wherein the substrate gripper further comprises a vacuum chuck overlying the motor in rotatable contact with a rotor of the motor.

6. The system according to claim 1, wherein the substrate gripper has a generally planar configuration.

7. The system according to claim, wherein the at least one sensory system comprises a capacitive sensor.

8. The system according to claim 1, wherein the at least one sensory system comprises an optical sensor.

9. The system according to claim 1, wherein the at least one sensory system comprises an acoustic sensor.

10. The system according to claim 1, wherein the at least one sensory system comprises two sensors.

11. The system according to claim 1, wherein the at least one sensory system comprises two sensors disposed near a leading edge of the end-effector.

12. The system according to claim 1, wherein control of the end-effector is achieved by using distributed control, said control processor being mounted close to the end-effector and operative to independently control the alignment feature.

13. The system according to claim 1, wherein said control processor and said sensory system provide substrate height detection for station and end-effector leveling.

14. The system according to claim 1, wherein said control processor performs real time station position calculation.

15. The system according to claim 1, wherein said sensory system provides data to said control processor for teaching station locations and re-teaching station locations.

16. The system according to claim 1, wherein said sensory system provides feedback to said control processor on whether said robotic arm and said end-effector are level relative to predetermined datum, on whether the stations are level relative to said robotic arm, and utilizes said predetermined datum to locate said robotic arm relative to said predetermined datum.

17. A system for transporting a substrate comprising:
   a robotic arm mounted on a support movable vertically and positionable in a horizontal plane for moving a substrata from one station to another station;
   an end-effector movably connected to an end of said robotic arm, said end-effector including:
      a base;
      a substrate gripper movably mounted to said base and operative to grip and ungrip the substrate; and
      at least one sensory system disposed to sense an edge of the substrate upon pausing a surface of the substrate, wherein the at least one sensory system comprises two sensors disposed to detect an edge location of the substrate and a third sensor disposed to detect a distance between the end-effector and an underside of the substrate; and a control processor in communication with the end-effector and the at least one sensory system and operative to calculate at least one of a location of the center and an alignment feature of said substrate based on data from said at least one sensory system and to generate an alignment signal to move said substrate gripper.

18. The system of claim 17, wherein said control processor transmits an instruction to the end-effector to orient the substrate while the robotic arm moves said substrate from the one station to the other station.

19. A system according to claim 17, wherein the at least one sensory system is disposed to pass an underside of said substrate.

20. The system according to claim 17, wherein the substrate gripper comprises a motor.

21. The system according to claim 20, wherein the motor comprises an annular stator and an annular rotor overlying the annular stator.

22. The system according to claim 20, wherein the substrate gripper further comprises a vacuum chuck overlying the motor in rotatable contact with a rotor of the motor.

23. The system according to claim 17, wherein the substrate gripper has a generally planar configuration.

24. The system according to claim 17, wherein the at least one sensory system comprises a capacitive sensor.

25. The system according to claim 17, wherein the at least one sensory system comprises, an optical sensor.

26. The system according to claim 17, wherein the at least one sensory system comprises an acoustic sensor.

27. The system according to claim 17, wherein the at least one sensory system comprises two sensors disposed near a leading edge of the end-effector.

28. A system for transporting a substrate comprising:
a robotic arm mounted on a support movable vertically and positionable in a horizontal plane for moving a substrate from one station to another station;
an end-effector movably connected to an end of said robotic arm, said end-effector including:
a base;
a substrate gripper movably mounted on said base and operative to grip and ungrip the substrate; and
at least one sensory system disposed to sense an edge of the substrate upon passing a surface of the substrate, wherein said sensory system comprises analog sensors; and
a control process or in communication with the end-effector and the at least one sensory system and operative to calculate at least one of a location of the center and an alignment feature of said substrate based on data from said at least one sensory system and to generate an alignment signal to move said substrate gripper, wherein said control processor calculates the center location and the alignment feature of said substrate based on real time analog signal/distance curve measurements and data processing.

29. The system according to claim 28, wherein the at least one sensory system comprises a capacitive sensor.

30. The system according to claim 28, wherein the at least one sensory system comprises an optical sensor.

31. The system according to claim 28, wherein the at least one sensory system comprises an acoustic sensor.

32. The system according to claim 28, wherein the at least one sensory system comprises two sensors.

33. The system according to claim 28, wherein the at least one sensory system comprises two sensors disposed near a leading edge of the end-effector.

34. A system for transporting a substrate comprising:
a robotic arm mounted on a support movable vertically and positionable in a horizontal plane for moving a substrate from one station to another station;
an end-effector movably connected to an end of said robotic arm, said end-effector including:
a base;
a substrate gripper movably mounted on said base and operative to grip and ungrip the substrate; and
at least one sensory system disposed to sense an edge of the substrate upon passing a surf ace of the substrate; and
a control processor in communication with the end-effector and the at least one sensory system and operative to calculate at least one of a location of the center and an alignment feature of said substrate based on data from said at least one sensory system and to generate an alignment signal to move said substrate gripper, wherein said control processor comprises a distributed control architecture for centering said robotic arm relative to said substrate, and said control processor calculates said alignment feature and the center location of said substrate while said robotic arm is moving towards a destination station by cooperation between controlling of said end-effector end said robotic arm in said distributed control architecture.

35. The system of claim 34, wherein said control processor transmits an instruction to the end-effector to orient the substrate while the robotic arm moves said substrate from the one station to the other station.

36. A system according to claim 34, wherein the at least one sensory system is disposed to pass an underside of said substrate.

37. The system according to claim 34, wherein the substrate gripper comprises a motor.

38. The system according to claim 37, wherein the motor comprises an annular stator and an annular rotor overlying the annular stator.

39. The system according to claim 37, wherein the substrate gripper further comprises a vacuum chuck overlying the motor in rotatable contact with a rotor of the motor.

40. The system according to claim 34, wherein the substrate gripper has a generally planar configuration.

41. The system according to claim 34, wherein the at least one sensory system comprises a capacitive sensor.

42. The system according to claim 34, wherein the at least one sensory system comprises an optical sensor.

43. The system according to claim 34, wherein the at least one sensory system comprises an acoustic sensor.

44. The system according to claim 34, wherein the at least one sensory system comprises two sensors.

45. The system according to claim 34, wherein the at least one sensory system comprises two sensors disposed near a leading edge of the end-effector.

46. A system for transporting a substrate comprising:
a robotic arm mounted on a su ort movable vertically and positionable in a horizontal plane for moving a substrate from one station to another station;
an end-effector movably connected to an end of said robotic arm, said end-effector including:
a base;
a substrate gripper movably mounted on said base and operative to grip and ungrip the substrate; and
at least one sensory system disposed to sense an edge of the substrate upon passing a surface of the substrate; and a control processor in communication with the end-effector and the at least one sensory system and operative to calculate at least one of a location of the center and an alignment feature of said substrate based on data from said at least one sensory system and to generate an alignment signal to move said substrate gripper, wherein said control processor comprises an algorithm for computing the center of said substrate in real time based on information from said at least one sensory system on the distance to the edge of said substrate, a relative height distance between said sensory system and said substrate, and the position of said robotic arm.

47. The system of claim 46, wherein said control processor transmits an instruction to the end-effector to orient the substrate while the robotic arm moves said substrate from the one station to the other station.

48. A system according to claim 46, wherein the at least one sensory system is disposed to pass an underside of said substrate.

49. The system according to claim 46, wherein the substrate gripper comprises a motor.

50. The system according to claim 49, wherein the motor comprises an annular stator and an annular rotor overlying the annular stator.

51. The system according to claim 49, wherein the substrate gripper further comprises a vacuum chuck overlying the motor in rotatable contact with a rotor of the motor.

52. The system according to claim 46, wherein the substrate gripper has a generally planar configuration.

53. The system according to claim 46, wherein the at least one sensory system comprises a capacitive sensor.

54. The system according to claim 46, wherein the at least one sensory system comprises an optical sensor.

55. The system according to claim 46, wherein the at least one sensory system comprises an acoustic sensor.

56. The system according to claim 46, wherein the at least one sensory system comprises two sensors.

57. The system according to claim 46, wherein the at least one sensory system comprises two sensors disposed near a leading edge of the end-effector.

58. A system for transporting wafers comprising:
an end-effector movably connected to an end of a robotic arm, said end-effector including:
a base;
a wafer gripper movably mounted on said base and operative to grip and ungrip the wafer; and
at least one sensory system comprising two sensor elements disposed near a leading edge of the end-effector to sense an edge of the wafer upon passing beneath a surface of the wafer; and
a control processor in communication with the end-effector and the at least one sensory system and operative to calculate a location of the center of said wafer based on data from said at least one sensory system and to generate an alignment signal to move said wafer gripper to grip said wafer centered on the end-effector.

59. A system for transporting wafers comprising:
an end-effector movably connected to an end of a robotic arm, said end-effector including;
a base;
a wafer gripper rotatably mounted on said base and operative to grip and ungrip the wafer; and
at least one sensory system disposed to sense a notch of the wafer upon passing the edge of the wafer; and
a control processor in communication with the end-effector and the at least one sensory system and operative to calculate a location of the notch of said wafer based on data from said at least one sensory system and to generate an orienting signal to rotate said wafer gripper to position the notch at a predetermined position.

60. A process for transferring a substrate of known shape and size from a source station to a destination station, comprising the steps of:
moving a robotic arm having an end-effector to a position beneath the substrate at the source station;
sensing at least two edge locations of the substrate;
determining a center of the substrate,
moving the end-effector to a desired position with respect to the center of the substrate;
gripping the substrate with the end-effector; and
transferring the substrate to the destination station and, during the transferring step, sensing a location of an alignment feature of the substrate and orienting the substrate on the end-effector with respect to the robotic arm to place the alignment feature in a desired orientation.

61. A process for transferring a substrate of known shape and size from a source station to a destination station, comprising the steps of:
moving a robotic arm having an end-effector to a position beneath the substrate at the source station;
gripping the substrate with the end-effector; and
transferring the substrate to the destination station; and
simultaneously with the transferring step, sensing a location of an alignment feature of the substrate and orienting the substrate on the end-effector to place the alignment feature in a desired orientation.

62. The process of claim 61, further comprising, prior to gripping the substrate:
determining a diameter of the substrate;
sensing at least two edge locations of the substrate;
determining a center of the substrate; and
moving the end-effector to a desired position with respect to the center of the substrate.

63. A system for transporting a substrate comprising:
a robotic arm mounted on a support movable vertically and positionable in a horizontal plane for moving a substrate from one station to another station;
an end-effector movably connected to an end of said robotic arm, said end-effector including:
a base;
a substrate gripper movably mounted on said base and operative to grip and ungrip the substrate, the substrate gripper comprising a motor including an annular stator and an annular rotor overlying the annular stator, and a vacuum chuck overlying the motor in contact with the rotor for rotation therewith; and
at least one sensory system disposed to sense an edge of the substrate upon passing a surface of the substrate; and
a control processor in communication with the end-effector and the at least one sensory system and operative to calculate at least one of a location of the center and an alignment feature of said substrate based on data from said at least one sensory system and to generate an alignment signal to move said substrate gripper.

* * * * *

UNITED STATES PATENT AND TRADEMARK OFFICE
CERTIFICATE OF CORRECTION

PATENT NO. : 6,813,543 B2
DATED : November 2, 2004
INVENTOR(S) : Martin Aalund et al.

It is certified that error appears in the above-identified patent and that said Letters Patent is hereby corrected as shown below:

Column 8,
Line 24, "claim," should read -- claim 1, --;
Line 58, "substrata" should read -- substrate --;
Line 65, "pausing" should read -- passing --;

Column 10,
Line 11, "surf ace" should read -- surface --;
Line 25, "end said" should read -- and said --; and
Line 56, "su ort" should read -- support --.

Signed and Sealed this

Twenty-fourth Day of January, 2006

JON W. DUDAS
*Director of the United States Patent and Trademark Office*